(12) United States Patent
Greywall et al.

(10) Patent No.: US 7,193,492 B2
(45) Date of Patent: Mar. 20, 2007

(54) MONOLITHIC MEMS DEVICE HAVING A BALANCED CANTILEVER PLATE

(75) Inventors: Dennis S. Greywall, Whitehouse Station, NJ (US); Dan Mark Marom, Howell, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 55 days.

(21) Appl. No.: 10/953,612

(22) Filed: Sep. 29, 2004

(65) Prior Publication Data

US 2006/0066423 A1  Mar. 30, 2006

(51) Int. Cl.
*H01H 51/22* (2006.01)
(52) U.S. Cl. ......................... 335/78; 200/181
(58) Field of Classification Search .................. 335/78; 200/181
See application file for complete search history.

(56) References Cited

U.S. PATENT DOCUMENTS

| | | | |
|---|---|---|---|
| 5,501,893 A | 3/1996 | Laermer et al. |
| 5,629,790 A | 5/1997 | Neukermans et al. |
| 6,093,330 A | 7/2000 | Chong et al. |
| 6,122,090 A | 9/2000 | Kino et al. |
| 6,201,631 B1 | 3/2001 | Greywall |
| 6,321,010 B1 | 11/2001 | Walker et al. |
| 6,337,760 B1 | 1/2002 | Huibers et al. |
| 6,351,329 B1 | 2/2002 | Greywall |
| 6,356,689 B1 | 3/2002 | Greywall |
| 6,369,374 B1 | 4/2002 | Greywall |
| 6,388,789 B1 | 5/2002 | Bernstein |
| 6,445,362 B1 | 9/2002 | Tegreene |
| 6,535,663 B1 | 3/2003 | Chertkow |
| 6,541,831 B2 | 4/2003 | Lee et al. |
| 6,590,267 B1 | 7/2003 | Goodwin-Johansson et al. |
| 6,590,313 B2 | 7/2003 | Agrawal et al. |

(Continued)

FOREIGN PATENT DOCUMENTS

| | | |
|---|---|---|
| EP | 0 703 429 A2 | 3/1996 |
| JP | 09159938 A | 6/1997 |

OTHER PUBLICATIONS

Chang Iu; Bar-Cohen Y, "Scaling Laws of Microactuators And Potential Applications Of Electroactive Polymers In MEMS," Proceedings of SPIE. Smart Structures and Materials 1999, Mar. 1, 1999, vol. 3669, pp. 345-354, XP009006525, USA.

*Primary Examiner*—Elvin Enad
*Assistant Examiner*—Bernard Rojas

(57) ABSTRACT

A MEMS device fabricated from a single multi-layered wafer, which alleviates the alignment problem associated with a two-piece prior-art design. In one embodiment, the MEMS device has a stationary part and a movable part rotatably coupled to the stationary part. The stationary part has an electrode and a first conducting structure electrically isolated from the electrode. The movable part has a rotatable plate and a second conducting structure located on the plate and electrically connected to the plate. The mass and location of the second conducting structure are selected such as to compensate for the plate's imbalance with respect to the rotation axis. In addition, at the rest position, the first and second conducting structures form, around the electrode, a substantially continuous barrier adapted to provide electrical shielding for the electrode. The movable part is adapted to rotate with respect to the stationary part in response to a voltage applied between the second conducting structure and the electrode such that the movable part cannot come into physical contact with the electrode during the rotation, which alleviates the snap-down problem inherent to many prior-art devices.

13 Claims, 3 Drawing Sheets

U.S. PATENT DOCUMENTS

| | | |
|---|---|---|
| 6,600,591 B2 | 7/2003 | Anderson et al. |
| 6,667,823 B2 | 12/2003 | Greywall |
| 6,695,457 B2 | 2/2004 | van Drieënhuizen et al. |
| 6,747,390 B2 * | 6/2004 | Park et al. ................. 310/309 |
| 2002/0011759 A1 | 1/2002 | Adams et al. |
| 2002/0018334 A1 | 2/2002 | Hill et al. |
| 2002/0135864 A1 | 9/2002 | Chiu et al. |
| 2002/0163051 A1 | 11/2002 | Gopal et al. |
| 2003/0116417 A1 * | 6/2003 | DeReus ..................... 200/181 |
| 2003/0117152 A1 | 6/2003 | Murphy |
| 2003/0169928 A1 | 9/2003 | Stanek |
| 2003/0209073 A1 | 11/2003 | Carroll et al. ........... 73/504.09 |
| 2003/0227361 A1 * | 12/2003 | Dickens et al. ................ 335/78 |
| 2004/0061414 A1 | 4/2004 | Greywall |
| 2004/0061619 A1 | 4/2004 | Kim et al. |
| 2004/0061924 A1 | 4/2004 | Greywall |
| 2004/0246558 A1 * | 12/2004 | Yoon et al. ................. 359/291 |

\* cited by examiner

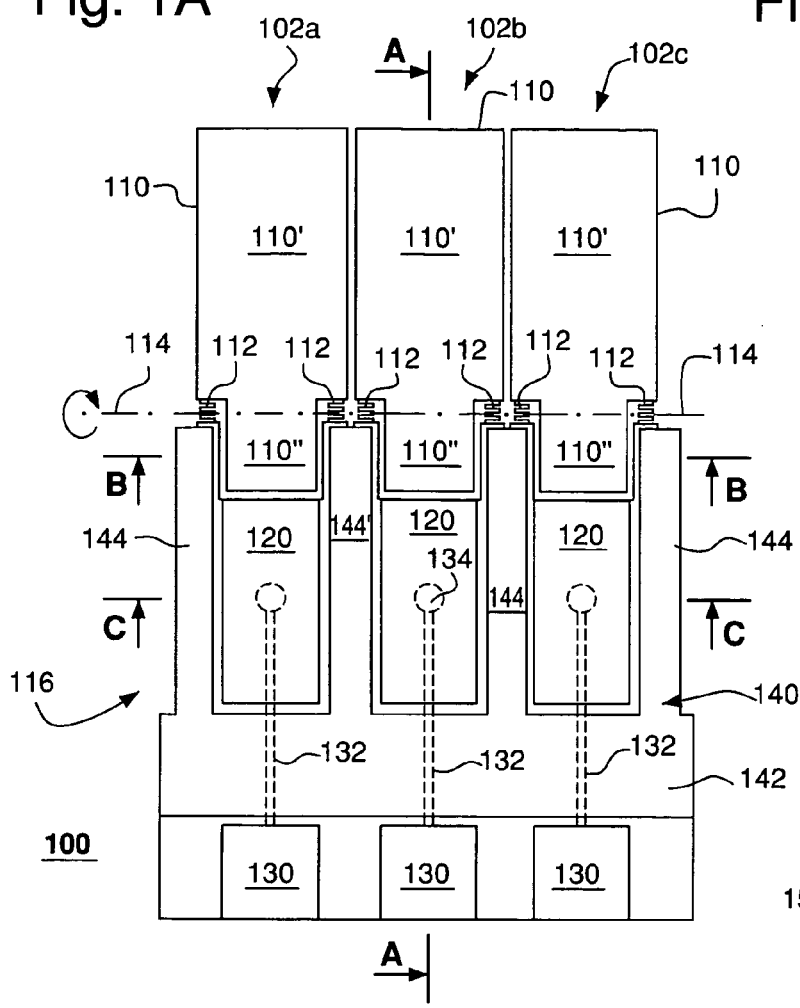
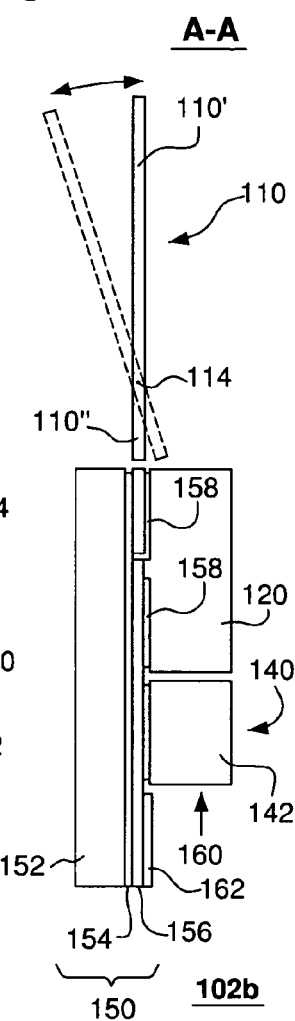
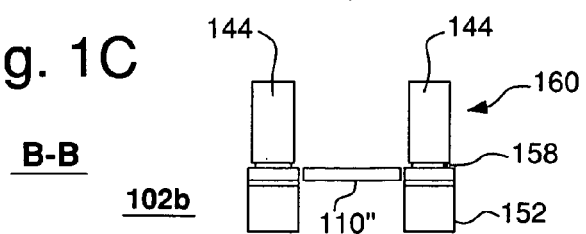
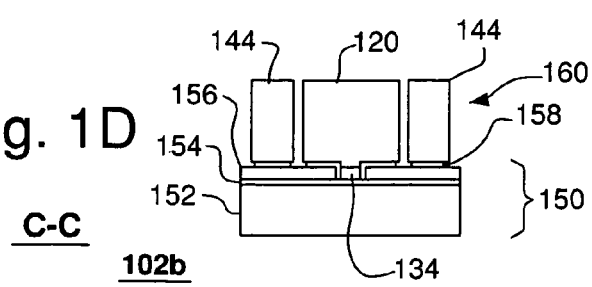

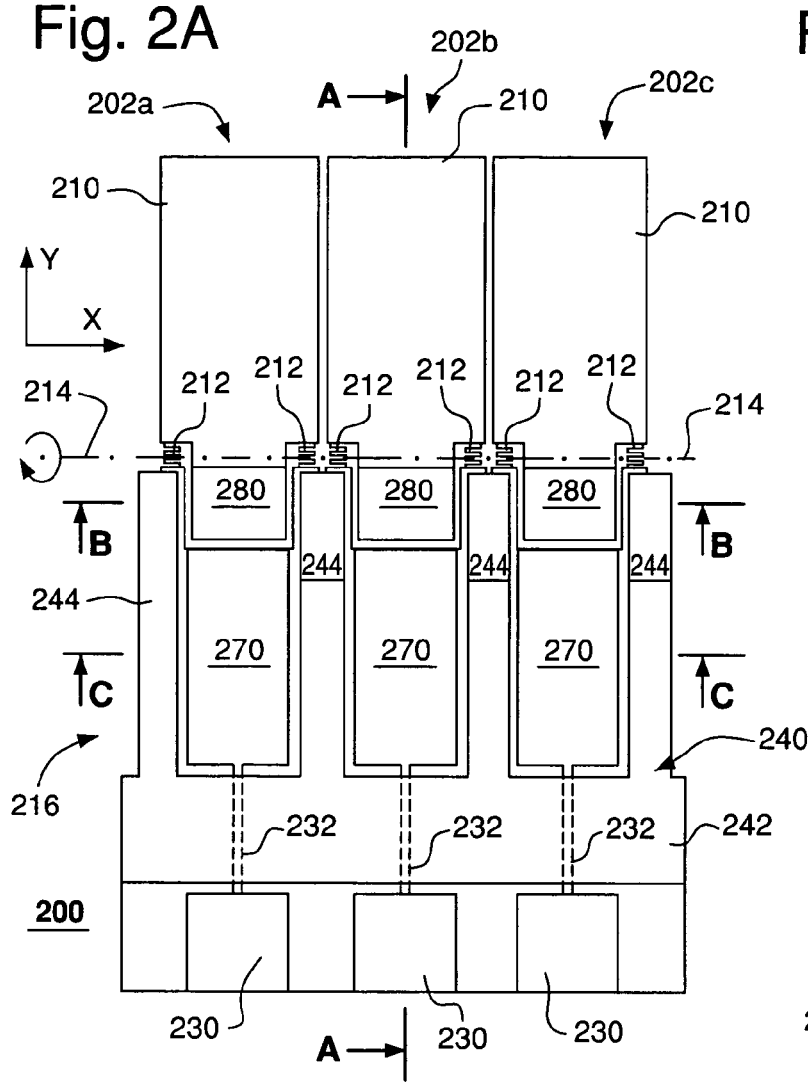
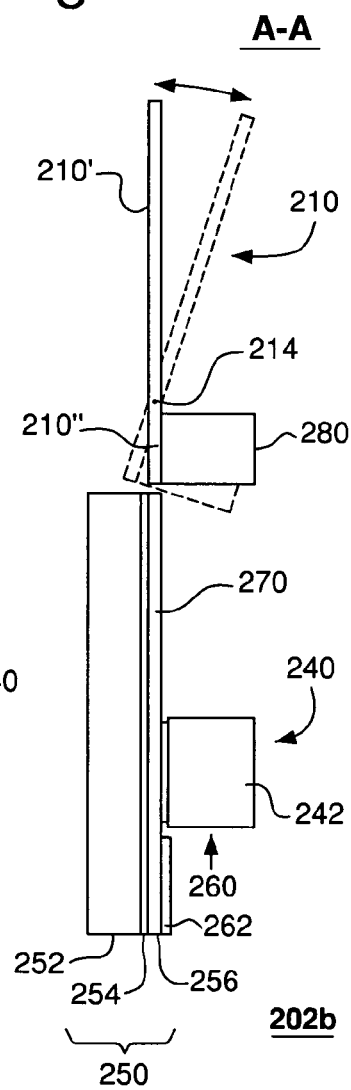
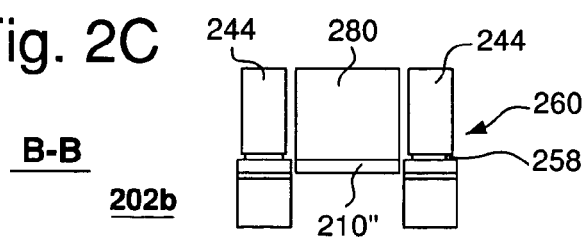
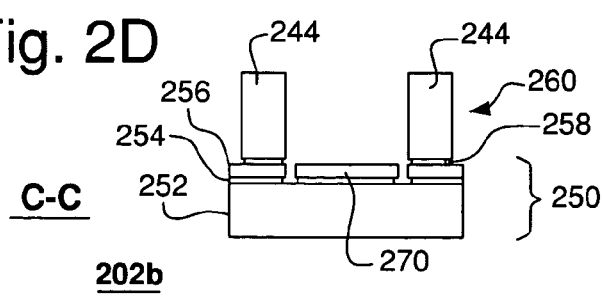

MONOLITHIC MEMS DEVICE HAVING A BALANCED CANTILEVER PLATE

CROSS-REFERENCE TO RELATED APPLICATIONS

The subject matter of this application is related to that of U.S. patent application Ser. No. 10/261,089 ("the '089 application"), filed Sep. 30, 2002, the teachings of which are incorporated herein by reference.

BACKGROUND OF THE INVENTION

1. Field of the Invention

The invention relates to optical communication equipment and, more specifically, to micro-electromechanical devices for use in such equipment.

2. Description of the Related Art

Optical communication equipment may employ micro-electromechanical systems (MEMS). A representative MEMS device may have an array of micro-machined mirrors, each mirror individually movable in response to an electrical signal. Such an array may be employed as an element of a wavelength-selective switch. In operation, at least one mirror in the array receives a beam of light. The beam is reflected from the mirror and can be controllably redirected to a different location (e.g., a selected output port) by controlling the rotation angle of the mirror.

One problem with prior-art MEMS devices is related to manufacturing such devices. During fabrication, two pieces, e.g., wafers, are used to form the MEMS device, which pieces must be accurately aligned to properly position the actuating electrodes with respect to the corresponding mirror. Such alignment may be difficult to achieve for relatively small mirrors and/or mirror arrays having a relatively large number of mirrors.

Another problem with prior-art MEMS devices is referred to as "snap-down." More specifically, when the voltage applied to an actuating electrode in such device exceeds a critical (snap-down) value, the tilt angle of the mirror increases rapidly and uncontrollably. This behavior may cause a collision of the mirror against the electrode and/or wafer, damaging the mirror and rendering the MEMS device inoperable.

SUMMARY OF THE INVENTION

Problems in the prior art are addressed, in accordance with the principles of the present invention, by a MEMS device fabricated from a single multi-layered wafer, which alleviates the alignment problem associated with a two-piece prior-art design. In one embodiment, the MEMS device has a stationary part and a movable part rotatably coupled to the stationary part. The stationary part has an electrode and a first conducting structure electrically isolated from the electrode. The movable part has a rotatable plate and a second conducting structure located on the plate and electrically connected to the plate. The mass and location of the second conducting structure are selected such as to compensate for the plate's imbalance with respect to the rotation axis. In addition, at the rest position, the first and second conducting structures form, around the electrode, a substantially continuous barrier adapted to provide electrical shielding for the electrode. The movable part is adapted to rotate with respect to the stationary part in response to a voltage applied between the second conducting structure and the electrode such that the movable part cannot come into physical contact with the electrode during the rotation, which alleviates the snap-down problem inherent to many prior-art devices.

BRIEF DESCRIPTION OF THE DRAWINGS

Other aspects, features, and benefits of the present invention will become more fully apparent from the following detailed description, the appended claims, and the accompanying drawings in which:

FIGS. 1A–D schematically show an arrayed switch that represents an exemplary embodiment of a switch disclosed in the above-cited '089 application;

FIGS. 2A–D schematically show an arrayed switch according to one embodiment of the invention.

DETAILED DESCRIPTION

Figure 3A:
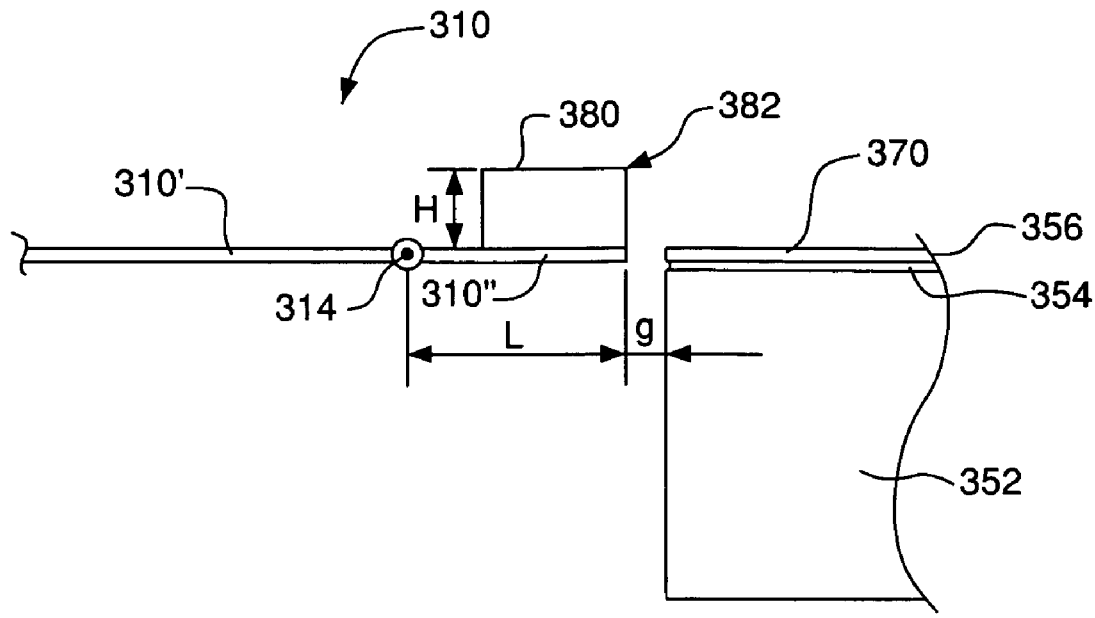
FIGS. 3A–B schematically show a MEMS device that can be used in the arrayed switch of FIG. 2 according to one embodiment of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

FIGS. 1A–D schematically show an arrayed switch 100 that represents an exemplary embodiment of a switch previously disclosed in the above-cited '089 application (see, e.g., FIGS. 12–13). More specifically, FIG. 1A shows a top view of switch 100, and FIGS. 1B–D show three cross-sectional views of the switch along section planes labeled A—A, B—B, and C—C, respectively. Switch 100 can be fabricated using a single multi-layered wafer, which alleviates the alignment problem associated with the two-piece prior-art design. In addition, switch 100 has a fringe-field (FF) actuator, one advantage of which is that the rotatable plate and the actuating electrode that form the FF actuator can be designed such that they cannot come into physical contact with one another during plate rotation. As a result, switch 100 does not have the snap-down problem inherent to many prior-art switches. A brief description of the features of switch 100 that are relevant to the present invention is provided below.

Referring to FIGS. 1A–B, switch 100 has three linearly arrayed MEMS devices 102 (labeled 102a, 102b, and 102c, respectively). Each device 102 has a movable plate 110 attached via a pair of serpentine springs 112 to a stationary structure 116, which springs 112 define a rotation axis 114 for the movable plate and enable rotation of the plate about that axis as indicated by the dashed line in FIG. 1B. Rotation axis 114 divides plate 110 into two portions located on different sides of the axis, which portions are labeled 110' and 110", respectively, in FIG. 1B. Portion 110", which is adjacent to stationary structure 116, is hereafter referred to as actuator arm 110".

For each device 102, stationary structure 116 has an electrode 120 connected via a corresponding conducting track 132 to a contact pad 130. Electrode 120, conducting track 132, and contact pad 130 are electrically isolated from the rest of the structure of device 102 and can be electrically biased with respect to plate 110, e.g., by the application to the contact pad of a bias voltage from an external voltage generator (not shown). Actuator arm 110" and electrode 120 form a fringe-field (FF) actuator in device 102.

Stationary structure 116 also has a conducting structure 140, one purpose of which is to reduce crosstalk between different devices 102 of switch 100. To achieve this purpose, conducting structure 140 has a wall 142 and fingers 144. Wall 142 is located between electrodes 120 and contact pads 130. Fingers 144 extend from wall 142 along the sides of electrodes 120 and actuator arms 110". As a result, conducting structure 140 surrounds each electrode 120 on three sides, thereby partially shielding the electrodes belonging to different devices 102 from one another. In addition, each corresponding finger 144 electrically shields the actuator arm 110" in one device 102 from the electric field generated by electrode 120 in an adjacent device 102. For example, the finger labeled 144' partially shields electrodes 120 in devices 102a and device 102b from one another. In addition, finger 144' electrically shields (i) actuator arm 110" in device 102a from electrode 120 in device 102b and (ii) actuator arm 110" in device 102b from electrode 120 in device 102a.

In a representative configuration, stationary structure 116 (with the exception of electrode 120, conducting track 132, and contact pad 130) is at a ground potential. Since springs 112 are made of a conducting material (e.g., silicon), plate 110 is also at the ground potential. When contact pad 130, conducting track 132, and electrode 120 are biased as explained above, there is a voltage differential between electrode 120 and actuator arm 110", which generates a corresponding electric field. The electric field, in turn, produces an attractive electrostatic force between electrode 120 and actuator arm 110", which causes the actuator arm to move toward the electrode, thereby rotating plate 110, e.g., as shown by the dashed line in FIG. 1B. A restoring force generated by the deformation of springs 112 is a force counteracting the electrostatic force. When the bias is removed, the spring's restoring force returns plate 110 to the initial rest position shown by the solid line in FIG. 1B.

In a representative embodiment, the fabrication of device 102 begins with a layered wafer 150 having three layers: a substrate layer 152, a thin insulating layer 154, and an overlayer 156. Layer 154 electrically isolates overlayer 156 from substrate layer 152. Overlayer 156 and substrate layer 152 are typically silicon, and insulating layer 154 is typically silicon oxide. During the fabrication process, additional layers of material are deposited over wafer 150. The various layers of the resulting layered structure are appropriately patterned and etched to form the various elements of device 102.

A detailed description of representative fabrication steps that can be employed in the fabrication process of device 102 can be found in the above-cited '089 application (see, e.g., FIGS. 11A–F). Briefly, overlayer 156 is first patterned and etched to define plate 110, springs 112, contact pad 130, and conducting track 132. Then, an additional insulating (e.g., silicon oxide) layer 158 is deposited over wafer 150, which insulating layer provides electrical insulation between electrode 120 and certain elements of stationary structure 116. Layer 158 is patterned and etched to expose plate 110, contact pad 130, and a portion 134 of conducting track 132. A relatively thick conducting (e.g., silicon) layer 160 is then deposited over the resulting structure. The material of layer 160 fills up the opening in layer 158 over portion 134 to form a conducting via structure, which electrically connects electrode 120 with conducting track 132. One or more similarly formed via structures (not shown) may be used to electrically connect (i) conducting structure 140 with overlayer 156 and (ii) overlayer 156 with substrate layer 152. Layer 160 is then patterned and etched to form electrode 120 and structure 140. Subsequently, a portion of substrate layer 152 corresponding to plate 110 is removed. Then, the exposed portions of insulating layer 154 are etched away to release plate 110 and springs 112. Finally, contact pad 130 is covered with a thin metal (e.g., gold) layer 162 (see FIG. 1B) to complete the fabrication process of device 102.

FIGS. 2A–D schematically show an arrayed switch 200 according to one embodiment of the present invention. FIG. 2A shows a top view of switch 200, and FIGS. 2B–D show three cross-sectional views of said switch along section planes A—A, B—B, and C—C, respectively. Similar to switch 100, switch 200 has three linearly arrayed MEMS devices 202 (labeled 202a, 202b, and 202c, respectively). Except where indicated, the structure of switch 200 is analogous to the structure of switch 100, and the analogous elements of the two structures are designated in FIGS. 1–2 with labels having the same last two digits. Structural differences between switches 200 and 100 are described in more detailed below.

Instead of electrode 120 of device 102, device 202 has an electrode 270. One difference between electrodes 120 (FIG. 1) and electrode 270 (FIG. 2) is that the former is formed using the extra layer 160 deposited over wafer 150, while the latter is formed using original overlayer 256 of wafer 250. Similar to conducting structure 140 of switch 100, conducting structure 240 of switch 200 is formed using the extra layer 260 deposited over wafer 250. As a result, in device 202, electrode 270 is recessed with respect to conducting structure 240 (see, e.g., FIGS. 2B and 2D). In contrast, electrode 120 sits at about the same level as conducting structure 140 (see, e.g., FIGS. 1B and 1D).

Compared to device 102 (FIG. 1), device 202 (FIG. 2) has a new element, i.e., a conducting structure 280 located on actuator arm 210" of movable plate 210 (see, e.g., FIGS. 2B and 2C). As such, conducting structure 280 is movable together with plate 210. Since conducting structure 280 is in direct electrical contact with plate 210, the conducting structure is part of an actuator that causes the plate to move. More specifically, conducting structure 280 and electrode 270 form a fringe-field actuator in device 202. Together with conducting structure 240, conducting structure 280 forms a substantially continuous conducting barrier around the corresponding electrode 270. In a typical implementation, the barrier has two gaps located at the corresponding transitions between conducting structures 240 and 280. However, each of the gaps is relatively narrow, e.g., has a width that is smaller than the width of the barrier itself. The term "barrier width" is used in reference to any one of the following sizes: the size of wall 242 in the Y-direction, the size of finger 244 in the X-direction, and the size of conducting structure in the Y-direction. The term "gap width" is used in reference to the size of the gap between finger 244 and conducting structure 280 in the X-direction. Conducting structure 280 may be formed similar to conducting structure 240, e.g., from the extra layer 260 deposited over wafer 250.

In a representative configuration, stationary structure 216 (with the exception of electrode 270, conducting track 232, and contact pad 230) is at a ground potential. Since springs 212 are made of a conducting material (e.g., silicon), plate 210 and conducting structure 280 are also at the ground potential. When contact pad 230, conducting track 232, and electrode 270 are biased with respect to the rest of stationary structure 216, there is a voltage differential between the electrode and conducting structure 280, which generates a corresponding electric field. The electric field, in turn, produces an attractive electrostatic force between electrode 270 and conducting structure 280, which causes the conducting structure to move toward the electrode, thereby rotating plate 210, e.g., as shown by the dashed line in FIG. 2B. A restoring force generated by the deformation of springs 212 is a force counteracting the electrostatic force. When the bias is removed, the spring's restoring force returns plate 210 to the initial rest position shown by the solid line in FIG. 2B.

The presence of conducting structure 280 in each device 202 results in several differences in the characteristics of switch 200 (FIG. 2) over those of switch 100 (FIG. 1). These differences are explained in more detail below.

First, the presence of conducting structure 280 improves the mechanical balance of plate 210 compared to that of plate 110. More specifically, briefly referring to FIG. 1B, because portion 110' typically has a greater length than actuator arm 110", the moment of inertia of the movable mass on one side of axis 114 is greater than that on the other side. In the absence of conducting structure 280, a similar statement is true for plate 210 (see, e.g., FIG. 2B). However, conducting structure 280 adds mass to the actuator-arm side of plate 210, thereby decreasing the moment-of-inertia disparity between the two sides. Furthermore, by properly choosing the mass of conducting structure 280 and appropriately placing the conducting structure on actuator arm 210" with respect to axis 214, it is possible to substantially or fully balance plate 210, i.e., to have substantially equal moments of inertia for the movable masses located on both sides of the axis. Having a balanced configuration of plate 210 may be beneficial because it makes the plate less susceptible to uncontrollable rotation that can be induced, for example, by external vibration or shock.

Second, the presence of conducting structure 280 improves electrical shielding for the corresponding electrode 270 in switch 200 compared to the electrical shielding of electrode 120 in switch 100. More specifically, in switch 100, conducting structure 140 provides electrical shielding of electrode 120 only along three sides of the electrode, with wall 142 shielding the electrode along one side and two fingers 144 shielding the electrode along two other sides (see FIG. 1A). Similar to conducting structure 140 in switch 100, conducting structure 240 in switch 200 provides electrical shielding of electrode 270 along three sides. However, in addition to the shielding provided by conducting structure 240, conducting structure 280 provides additional electrical shielding along the fourth side of the electrode (see FIG. 2A). This additional electrical shielding may advantageously decrease the level of crosstalk between different devices 202 in switch 200 compared to that between different devices 102 in switch 100.

Third, due to the presence of conducting structure 280, for a given bias voltage, device 202 is capable of generating a greater deflection angle for plate 210 compared to that generated for plate 110 in device 102. This deflection-angle difference can qualitatively be understood as follows. When plate 110 rotates as shown in FIG. 1B, the separation (gap) between actuator arm 110" and the side of electrode 120 facing plate 110 increases with an increase of the rotation angle. The increased separation, in turn, decreases the effective FF strength and the resulting torque acting upon plate 110 from electrode 120. In contrast, when plate 210 rotates as shown in FIG. 2B, the separation (gap) between conducting structure 280 and the side of electrode 270 facing plate 210 decreases with an increase of the rotation angle. The decreased separation, in turn, increases the effective FF strength and the torque acting upon plate 210 from electrode 270. Thus, rotation of the plate has a qualitatively different effect on the effective electrostatic torque in devices 102 and 202. As a result, at the same bias voltage, device 202 produces a greater deflection angle for plate 210 compared to that produced for plate 110 in device 102. Alternatively, this property of device 202 can be viewed as a capability to attain a desired deflection angle at a lower bias voltage than that necessary to attain that same deflection angle in device 102.

Figure 3B:
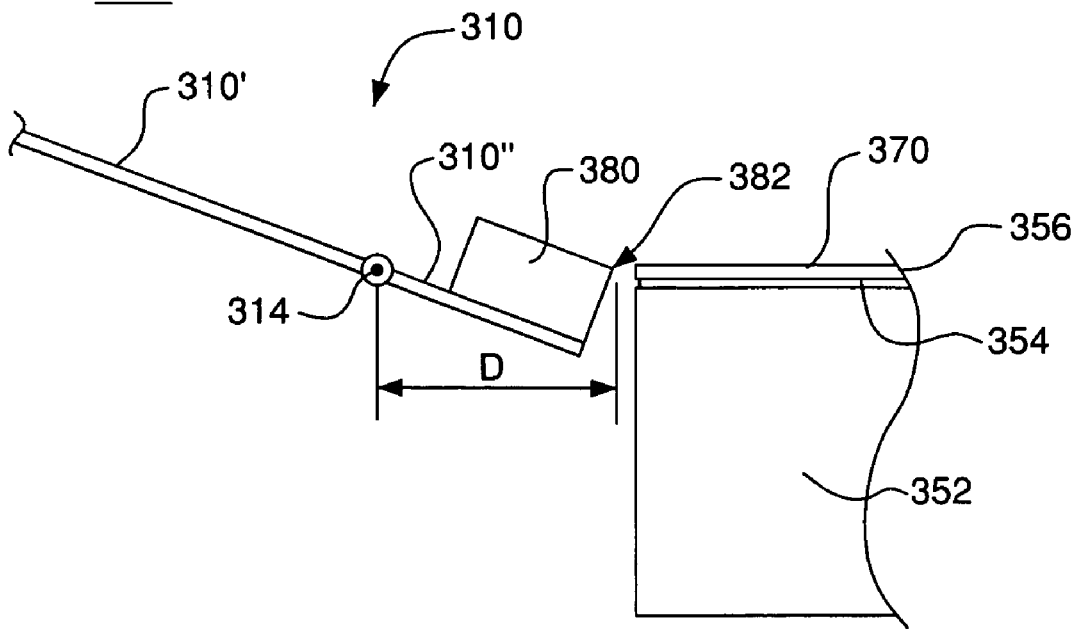

FIGS. 3A–B schematically show a MEMS device 302 that can be used as MEMS device 202 in switch 200 (FIG. 2) according to one embodiment of the invention. More specifically, FIG. 3A is a side view of device 302 with a movable plate 310 shown in the initial rest position, and FIG. 3B is a side view of device 302 with the movable plate 310 shown in a deflected position. MEMS device 302 of FIG. 3 is analogous to a MEMS device 202 of FIG. 2, and the analogous elements of the two devices are designated in FIGS. 2 and 3 with labels having the same last two digits. However, one difference between devices 202 and 302, is that the latter is specifically designed such that conducting structure 380 cannot come into physical contact with electrode 370 upon rotation of plate 310 about axis 314.

Referring to FIG. 3A, conducting structure 380 located on actuator arm 310" of movable plate 310 has height H; actuator arm 310" of plate 310 has length L; and, in the initial rest position, the separation (gap) between electrode 370 and actuator arm 310" is g. Referring to FIG. 3B, the minimum possible separation between conducting structure 380 and electrode 370 is achieved when a corner 382 of the conducting structure rotates about axis 314 down to the level of the electrode, as shown in the figure. This position corresponds to a rotation angle $\theta_0 = \arctan(H/L)$, which rotation angle can also be considered as an approximation of the maximum rotation angle attainable in device 302 with the electrostatic actuation effected by electrode 370. Device 302 prevents physical contact between conducting structure 380 and electrode 370 by having g>D−L, where $D=(L^2+H^2)^{1/2}$. Table 1 below provides representative values of H, L, and g that can be used in different implementations of device 302. The values of $\theta_0$ corresponding to those implementations are provided in Table 1 as well.

TABLE 1

Representative Dimensions and Maximum Rotation Angles for Different Implementations of MEMS Device 302

| H (μm) | L (μm) | g (μm) | D-L (μm) | $\theta_0$ (degrees) |
|---|---|---|---|---|
| 10 | 20 | 3 | 2.36 | 26.6 |
| 10 | 30 | 2.5 | 1.62 | 18.4 |
| 10 | 40 | 2 | 1.23 | 14.0 |
| 10 | 50 | 2 | 0.99 | 11.3 |

Although switches of the invention have been described in reference to using silicon/silicon oxide SOI wafers, other suitable materials, such as germanium-compensated silicon, may similarly be used. The materials may be appropriately doped as known in the art. Various surfaces may be modified, e.g., by metal deposition for enhanced reflectivity and/or electrical conductivity or by ion implantation for enhanced mechanical strength. Differently shaped plates, actuator arms, electrodes, barriers, conducting structures, and/or support structures may be utilized without departing from the scope and principle of the invention. A movable plate (e.g., plate 210 of FIG. 2) may be coupled to the corresponding stationary part using one or more differently configured springs, where the term "spring" refers in general to any suitable elastic structure that can recover its original shape after being distorted. A different layout for conducting tracks may be realized as necessary and/or apparent to a person skilled in the art.

A MEMS device of the invention may be configured to achieve any rotation angle within the working angle range based on the appropriate selection/adjustment of voltage(s). Individual MEMS devices of the invention may be differently arrayed to provide linear, radial, or two-dimensional arrays of mirrors. A resulting arrayed device may have two or more of such individual MEMS devices.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

For the purposes of this specification, a MEMS device is a device having two or more parts adapted to move relative to one another, where the motion is based on any suitable interaction or combination of interactions, such as mechanical, thermal, electrical, magnetic, optical, and/or chemical interactions. MEMS devices are fabricated using micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. The scale/size of certain elements in a MEMS device may be such as to permit manifestation of quantum effects. Examples of MEMS devices include, without limitation, NEMS (nano-electromechanical systems) devices, MOEMS (micro-opto-electromechanical systems) devices, micromachines, microsystems, and devices produced using Microsystems technology or Microsystems integration.

Although the present invention has been described in the context of implementation as MEMS devices, the present invention can in theory be implemented at any scale, including scales larger than micro-scale.

What is claimed is:

1. A device, comprising:
   a stationary part having an electrode;
   a movable part movably coupled to the stationary part by one or more springs, each spring connected between said movable and stationary parts, the movable part having a first conducting structure, wherein:
   the electrode and the first conducting structure form an actuator;
   the movable part is adapted to rotate with respect to the stationary part about a rotation axis defined by said one or more springs in response to a voltage differential applied to the actuator;
   the movable part has a short portion and a long portion with respect to said rotation axis, said short and long portions forming an unbalanced plate; and
   the first conducting structure is located at said short portion such that the mass of the first conducting structure at least partially compensates for the plate's imbalance; and
   a substantially continuous conducting barrier around the perimeter of the electrode, said barrier adapted to provide electrical shielding for the electrode, wherein the first conducting structure is a part of said barrier.

2. The invention of claim 1, wherein the actuator is a fringe-field actuator.

3. The invention of claim 1, wherein the movable part has substantially equal moments of inertia of movable masses located on different sides of the rotation axis.

4. The invention of claim 1, wherein the rotation axis is located at a distance with respect to the stationary part at which, for any rotation angle accessible to the movable part through the application of voltage differential to the actuator, there is a clearance between the movable and stationary parts due to which the movable part cannot come into physical contact with the electrode during the rotation.

5. The invention of claim 1, wherein rotation away from a rest position corresponding to a zero voltage differential caused by the application to the actuator of a non-zero voltage differential decreases separation between the electrode and the first conducting structure.

6. The invention of claim 1, wherein the one or more springs comprise two serpentine springs.

7. The invention of claim 1, wherein the device is fabricated using a single multi-layered wafer.

8. The invention of claim 7, wherein:
   the substantially continuous conducting barrier and the electrode are formed within different layers of the wafer; and
   the electrode is recessed within an opening defined by the substantially continuous conducting barrier.

9. The invention of claim 1, wherein the device is a MEMS device, which is a part of a switch having two or more instances of said MEMS device, wherein the substantially continuous conducting barrier is adapted to inhibit crosstalk between different instances of the MEMS device.

10. The invention of claim 1, wherein, for each gap in the substantially continuous conducting barrier, a dimension of the gap along the barrier length is smaller than the barrier width.

11. The invention of claim 1, wherein the substantially continuous conducting barrier further comprises a second conducting structure, said second conducting structure being a part of the stationary part.

12. A device, comprising:
   a stationary part having an electrode and a first conducting structure electrically isolated from the electrode; and
   a movable part movably coupled to the stationary part and having a second conducting structure, said movable part adapted to rotate, about a rotation axis, with respect to the stationary part in response to a voltage applied between the movable part and the electrode, wherein the movable part is at a rest position if the applied voltage is zero, wherein the device is characterized by each of (A), (B), and (C), where:
   (A) at the rest position, the first and second conducting structures form a substantially continuous electromagnetic (e-m) barrier around the perimeter of the electrode;
   (B) rotation away from the rest position caused by the applied voltage decreases separation between the electrode and the second conducting structure; and
   (C) the movable part has a short portion and a long portion with respect to the rotation axis, said short and long portions forming an unbalanced plate, wherein the second conducting structure at least partially compensates for the plate's imbalance.

13. The invention of claim 11, wherein:

each of the first and second conducting structures is a continuous structure having no gaps along its length; and the substantially continuous conducting barrier has two gaps, each located between the first and second conducting structures.

* * * * *